United States Patent
Yang

(10) Patent No.: US 12,513,936 B1
(45) Date of Patent: Dec. 30, 2025

(54) COMPLEMENTARY SEMICONDUCTOR DEVICES USING HALIDE PEROVSKITE THIN FILMS

(71) Applicant: Industry-Academic Cooperation Foundation, Kunsan National University, Gunsan-si (KR)

(72) Inventor: Jung Yup Yang, Gunsan-si (KR)

(73) Assignee: Industry-Academic Cooperation Foundation, Kunsan National University, Gunsan-si (KR)

( * ) Notice: Subject to any disclaimer, the term of this patent is extended or adjusted under 35 U.S.C. 154(b) by 0 days.

(21) Appl. No.: 19/260,224

(22) Filed: Jul. 3, 2025

(30) Foreign Application Priority Data

Mar. 18, 2025 (KR) ........................ 10-2025-0034438

(51) Int. Cl.
| | | |
|---|---|---|
| H01L 51/05 | (2006.01) | |
| H10D 30/47 | (2025.01) | |
| H10D 62/10 | (2025.01) | |
| H10D 62/80 | (2025.01) | |
| H10D 84/85 | (2025.01) | |
| H10D 86/40 | (2025.01) | |
| H10D 30/01 | (2025.01) | |
| H10D 84/01 | (2025.01) | |
| H10D 86/01 | (2025.01) | |

(52) U.S. Cl.
CPC ......... H10D 30/481 (2025.01); H10D 62/126 (2025.01); H10D 62/883 (2025.01); H10D 84/856 (2025.01); H10D 86/411 (2025.01); H10D 86/423 (2025.01); H10D 30/017 (2025.01); H10D 84/0167 (2025.01); H10D 86/0221 (2025.01)

(58) Field of Classification Search
CPC .... H10D 30/481; H10D 30/47; H10D 30/017; H10D 30/01; H10D 62/126; H10D 62/10; H10D 62/883; H10D 62/80; H10D 84/856; H10D 84/85; H10D 84/0167; H10D 84/01; H10D 86/411; H10D 86/40; H10D 86/423; H10D 86/0221
See application file for complete search history.

(56) References Cited

U.S. PATENT DOCUMENTS

| | | | |
|---|---|---|---|
| 10,069,025 B2 * | 9/2018 | Snaith | H10F 10/161 |
| 10,629,833 B2 * | 4/2020 | Kedem | C08K 3/045 |
| 2015/0249170 A1 * | 9/2015 | Snaith | H10F 77/16 |
| | | | 136/265 |
| 2018/0145271 A1 * | 5/2018 | Kedem | H10K 30/30 |
| 2018/0247968 A1 * | 8/2018 | Na | H10F 30/2218 |
| 2019/0288123 A1 * | 9/2019 | Kallioinen | H10F 30/2843 |
| 2019/0305121 A1 * | 10/2019 | Sharma | H10D 30/031 |
| 2021/0020744 A1 * | 1/2021 | Duan | H10D 62/124 |
| 2022/0238823 A1 * | 7/2022 | Ferguson | H10K 10/481 |
| 2024/0006129 A1 * | 1/2024 | Liu | H10K 85/50 |
| 2024/0188435 A1 * | 6/2024 | Liu | C07F 9/5728 |

FOREIGN PATENT DOCUMENTS

| | | |
|---|---|---|
| JP | 2017-98518 A | 6/2017 |
| JP | 7503777 B1 | 6/2024 |
| KR | 10-2646916 B1 | 3/2024 |
| KR | 10-2024-0116984 A | 7/2024 |
| KR | 10-2744908 B1 | 12/2024 |

OTHER PUBLICATIONS

Kang, Dong-Ho et al., "An Ultrahigh-Performance Photodetector based on a Perovskite—Transition-Metal- Dichalcogenide Hybrid Structure," Adv. Mater., Jun. 2016. doi: 10.1002/adma.201600992.
Lee, Sung-Joon et al., (2023) "Lead halide perovskite sensitized WSe2 photodiodes with ultrahigh open circuit voltages," SpringerOpen. doi: 10.1186/s43593-023-00040-8.
Office Action for JP 2025-116985 by Japan Patent Office dated Aug. 19, 2025.

* cited by examiner

*Primary Examiner* — Nikolay K Yushin
(74) *Attorney, Agent, or Firm* — BROADVIEW IP LAW, PC

(57) ABSTRACT

A halide perovskite-based complementary semiconductor device according to an embodiment of the present invention includes a substrate, a two-dimensional material layer formed on an upper surface side of the substrate and including a hole injection layer and an electron injection layer, a halide perovskite layer formed on the two-dimensional material layer, and an electrode layer formed on the halide perovskite layer and including a drain electrode, an output electrode, and a source electrode.

13 Claims, 8 Drawing Sheets

(A)

(B)

COMPLEMENTARY SEMICONDUCTOR DEVICES USING HALIDE PEROVSKITE THIN FILMS

CROSS-REFERENCE TO RELATED APPLICATION

This application claims priority to and the benefit of Korean Patent Application No. 10-2025-0034438, filed on Mar. 18, 2025, the disclosure of which is incorporated herein by reference in its entirety.

BACKGROUND

1. Field of the Invention

The present invention relates to the field of electronics and semiconductor engineering, and more particularly, to a semiconductor device structure including two-dimensional materials and halide perovskite materials and a method for manufacturing the same.

2. Discussion of Related Art

Thin film transistors (TFTs) are widely used as display driving devices. Currently commercialized technologies are mainly limited to n-channel TFTs using InGaZnO materials as channels, which presents limitations from a circuit perspective. To overcome these limitations, research on the development of p-channel TFT devices is actively being conducted. However, commercialization faces difficulties due to the absence of oxide semiconductor thin films with p-channel (hole-driven) characteristics.

Halide perovskite thin films have high field effect mobility ($>50$ cm$^2$/Vs) and are attracting attention as channel materials for p-channel TFT devices. In particular, they have the advantage of being easily applicable to glass substrates and flexible substrates because they can be manufactured at low process temperatures. However, halide perovskite thin films have excellent p-channel characteristics but are difficult to implement n-channel characteristics due to the energy band structure characteristics of the material, which limits the fabrication of complementary semiconductor devices using only a single material. As a result, most complementary semiconductor devices reported to date adopt a method of combining p-channel TFTs based on halide perovskite materials and n-channel TFTs based on InGaZnO materials.

Halide perovskite materials have various advantages such as excellent photoresponse characteristics, high charge mobility, potential for low-cost mass production, and inherent flexibility. However, the following problems exist in actual device fabrication and application processes:

1) Limitations in electrical property control: The conversion of perovskite conductivity type (p-type/n-type) mainly depends on chemical composition changes, which limits device design and property control.
2) Process compatibility issues: Compatibility with existing semiconductor processes such as photolithography is low, making it difficult to apply fine processes.
3) Stability issues: Due to vulnerability to atmospheric conditions such as moisture and oxygen, material property degradation occurs during processing, making it difficult to ensure device reliability and stability.

Due to these technical limitations, the practical application and commercialization of halide perovskite-based electronic devices are being delayed, and there is a need for technology development and research on halide perovskite-based devices.

SUMMARY OF THE INVENTION

An object to be solved by the present invention is to provide a semiconductor device with a novel structure capable of selectively controlling the semiconductor type of halide perovskite thin films by utilizing vacancy characteristics of two-dimensional materials.

An object to be solved by the present invention is to implement a semiconductor device capable of simultaneously forming p-type and n-type regions within a single halide perovskite thin film by controlling M-vacancy and X-vacancy in MX$_2$ (M: transition metal, X: chalcogenide) series two-dimensional materials.

An object to be solved by the present invention is to provide a complementary semiconductor device that can be manufactured in a single process through a multilayer structure of two-dimensional material layers and halide perovskite layers and operates stably.

The objects to be solved by the present invention are not limited to the above-mentioned objects, and unmentioned objects will be clearly understood by those skilled in the art from this specification and the attached drawings.

A halide perovskite-based complementary semiconductor device according to an embodiment of the present invention may include a substrate, a two-dimensional material layer formed on an upper surface side of the substrate and including a hole injection layer and an electron injection layer, a halide perovskite layer formed on the two-dimensional material layer, and an electrode layer formed on the halide perovskite layer and including a drain electrode, an output electrode, and a source electrode.

The means for solving the objects of the present invention are not limited to the above-mentioned solutions, and unmentioned solutions will be clearly understood by those skilled in the art from this specification and the attached drawings.

According to the halide perovskite-based complementary semiconductor device according to embodiments of the present invention, the conductivity type of halide perovskite can be selectively controlled by utilizing intrinsic vacancy characteristics of two-dimensional materials. Specifically, S-vacancy acts as an electron-rich (e-rich) electron injection layer, and W-vacancy acts as an electron-poor (e-poor) hole injection layer, effectively inducing semiconductor type inversion. In addition, the charge injection control method using vacancy characteristics of two-dimensional materials enables very precise conductivity type adjustment. Since S-vacancy and W-vacancy perform roles as donor and acceptor, respectively, the charge transport characteristics of the perovskite layer can be locally and precisely adjusted, enabling implementation of various logic devices including inverters.

According to the halide perovskite-based complementary semiconductor device according to embodiments of the present invention, unlike conventional heterogeneous material combination methods, complementary semiconductor devices can be implemented using only a single halide perovskite material, and p-type and n-type regions can be simultaneously formed within one material, simplifying the process and improving uniformity of device characteristics. This device structure enables low-temperature processing and can be applied to various substrate materials such as glass substrates or plastic substrates, and is particularly suitable for flexible substrates and can be utilized as flexible electronic devices. In addition, compatibility with existing semiconductor processes such as photolithography can be enhanced, and device reliability and stability can be improved by improving moisture stability.

The effects of the present invention are not limited to the above-mentioned effects, and unmentioned effects will be clearly understood by those skilled in the art from this specification and the attached drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
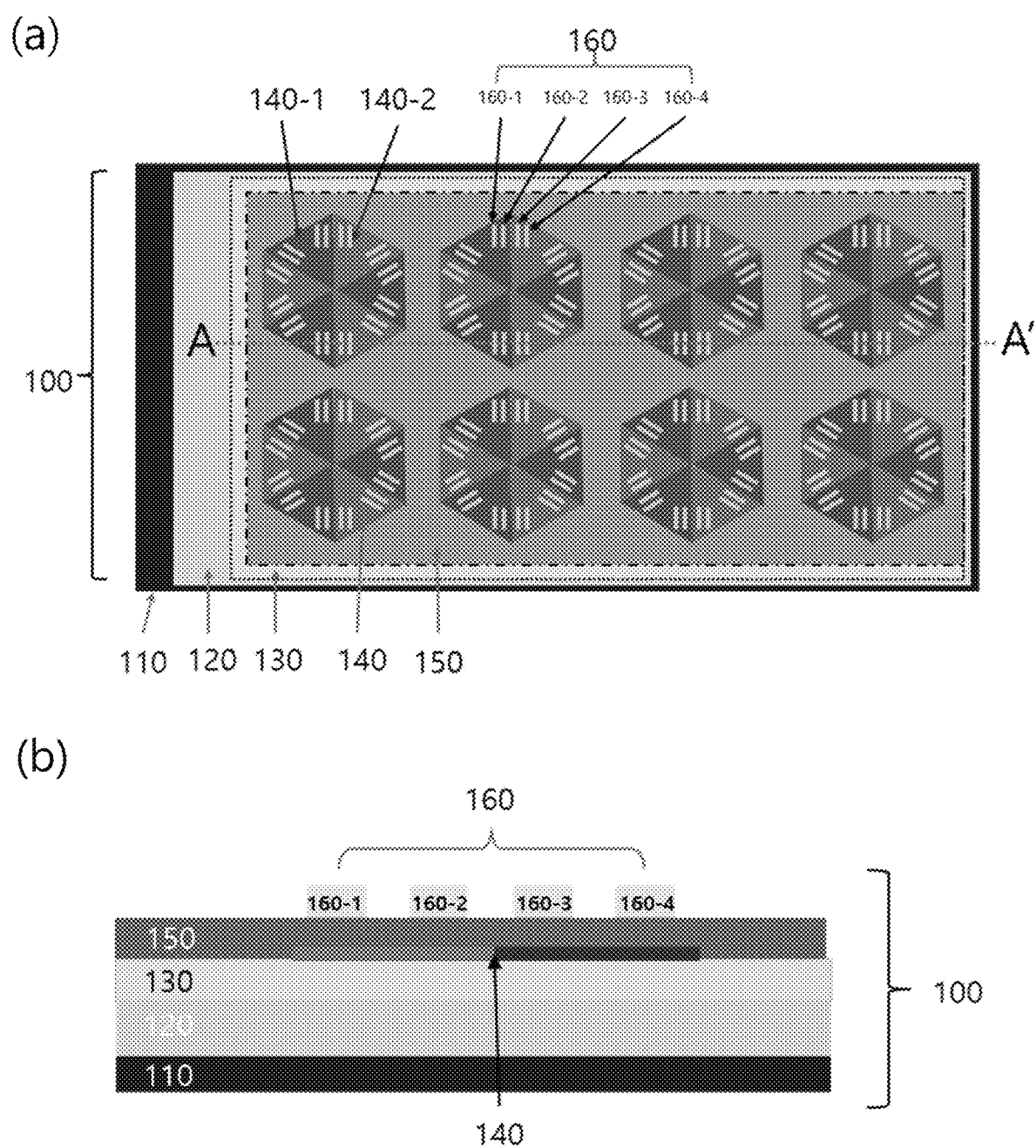
FIG. 1 shows a halide perovskite-based complementary semiconductor device including two-dimensional materials according to an embodiment of the present invention.

The above-mentioned objects, features, and advantages of the present application will become more apparent through the following detailed description in relation to the accompanying drawings. However, since the present application can be modified in various ways and can have various embodiments, specific embodiments will be illustrated in the drawings and described in detail below.

Throughout the specification, the same reference numerals indicate, in principle, the same components. In addition, components having the same function within the scope of the same concept appearing in the drawings of each embodiment are described using the same reference numerals, and redundant descriptions thereof will be omitted.

When it is determined that a detailed description of known functions or configurations related to the present application may unnecessarily obscure the gist of the present application, the detailed description thereof is omitted. In addition, numbers (for example, first, second, etc.) used in the description process of this specification are merely identification symbols for distinguishing one component from another component.

In addition, the suffixes "module" and "unit" for components used in the following embodiments are given or used interchangeably only for ease of specification preparation, and do not have meanings or roles that are distinct from each other.

In the following embodiments, singular expressions include plural expressions unless the context clearly indicates otherwise.

In the following embodiments, terms such as "include" or "have" mean that features or components described in the specification exist, and do not exclude in advance the possibility of adding one or more other features or components.

In the drawings, components may be exaggerated or reduced in size for convenience of description. For example, the size and thickness of each component shown in the drawings are arbitrarily shown for convenience of description, and the present invention is not necessarily limited to what is shown.

When a certain embodiment can be implemented differently, the order of a specific process may be performed differently from the described order. For example, two processes described consecutively may be performed substantially simultaneously, or may proceed in an order opposite to the described order.

In the following embodiments, when components and the like are said to be connected, this includes not only cases where components are directly connected, but also cases where components are indirectly connected with components interposed between the components. For example, in this specification, when components and the like are said to be electrically connected, this includes not only cases where components and the like are directly electrically connected, but also cases where components and the like are indirectly electrically connected with components and the like interposed therebetween.

A halide perovskite-based semiconductor device according to an embodiment of the present application may include: a substrate; a two-dimensional material layer formed on an upper surface side of the substrate and including a hole injection layer and an electron injection layer; a halide perovskite layer formed on the two-dimensional material layer; and an electrode layer formed on the halide perovskite layer and including a drain electrode, an output electrode, and a source electrode.

According to an embodiment of the present application, the hole injection layer of the two-dimensional material layer injects holes into the halide perovskite layer so that a first region of the halide perovskite layer has p-type semiconductor characteristics, and the electron injection layer of the two-dimensional material layer injects electrons into the halide perovskite layer so that a second region of the halide perovskite layer has n-type semiconductor characteristics.

According to an embodiment of the present application, the hole injection layer forms a first contact potential at an interface with the halide perovskite layer, and the electron injection layer forms a second contact potential at an interface with the halide perovskite layer, such that the first region having p-type semiconductor characteristics and the second region having n-type semiconductor characteristics are locally formed in the halide perovskite layer by a difference between the first contact potential and the second contact potential.

According to an embodiment of the present application, the two-dimensional material layer may be characterized by comprising a transition metal chalcogenide material including any one of $WS_2$, $MoS_2$, $WSe_2$, $MoSe_2$, $NbSe_2$, $TaS_2$, and $Bi_2Se_3$.

According to an embodiment of the present application, the two-dimensional material layer includes $WS_2$, the hole injection layer comprises W-vacancy $WS_2$, and the electron injection layer comprises S-vacancy $WS_2$.

According to an embodiment of the present application, the halide perovskite layer may be characterized by being selected from the group consisting of $MAPbI_3$, $MAPbBr_3$, $MAPbCl_3$, $FAPbI_3$, $FAPbBr_3$, $FAPbCl_3$, $CsPbI_3$, $CsPbBr_3$, $CsPbCl_3$, $RbPbI_3$, $RbPbBr_3$, $RbPbCl_3$, $CsPb(I_{1-x}Br_x)_3$, $MASnI_3$, $MASnBr_3$, $MASnCl_3$, $FASnI_3$, $FASnBr_3$, $FASnCl_3$, $CsSnI_3$, $CsSnBr_3$, $CsSnCl_3$, $MAGeI_3$, $FAGeI_3$, $CsGeI_3$, $Cs_2AgBiBr_6$, $Cs_2AgBiCl_6$, $Cs_2AgSbBr_6$, $MAPb(I_{1-x}Br_x)_3$, $CsPb(Br_{1-x}Cl_x)_3$, $FAPb(I_{1-x}Br_x)_3$, $(PEA)_2PbI_4$ (Phenethylammonium Lead Iodide), $(FPEA)_2PbI_4$ (4-fluoro-phenethylammonium lead iodide), $(PEA)_2SnI_4$ (Phenethylammonium Tin Iodide), $(FPEA)_2SnI_4$ (4-fluoro-phenethylammonium Tin iodide), $(BA)_2(MA)_{n-1}Pb_nI_{3n+1}$ (Butylammonium-based), $Cs_2AgBiBr_6$, $Cs_2InBiCl_6$, $Cs_2SnI_6$, $Cs_2TiI_6$, and combinations thereof.

According to an embodiment of the present application, the two-dimensional material layer may be formed to have at least one two-dimensional material having at least one hexagonal structural pattern.

According to an embodiment of the present application, the hexagonal structural pattern may be characterized by being configured by being divided into hole injection regions corresponding to the hole injection layer and electron injection regions corresponding to the electron injection layer, which are alternately arranged with respect to the center.

According to an embodiment of the present application, the drain electrode may be connected to a power supply voltage (VDD), the source electrode may be connected to a ground voltage (VSS), and the output electrode may be configured to provide an output voltage (Vout).

According to an embodiment of the present application, the semiconductor device may further comprise a rear input electrode layer formed on a rear surface side of the substrate, and the rear input electrode layer may be configured to provide an input voltage (Vin).

According to an embodiment of the present application, the semiconductor device may further comprise a passivation layer formed on at least a portion of the halide perovskite layer and the electrode layer, and the passivation layer may be characterized by protecting devices included in the semiconductor device from external environment to improve stability.

According to an embodiment of the present application, the semiconductor device may further comprise a gate insulating layer formed between the substrate and the two-dimensional material layer, and the two-dimensional material layer may be formed on at least a portion of a surface of the gate insulating layer.

According to an embodiment of the present application, the two-dimensional material layer may be formed to have a pattern with a quadrilateral structure patterned by etching a material having a hexagonal structural pattern through mechanical scribing or laser scribing.

According to an embodiment of the present application, the substrate may be formed of glass or a flexible substrate, and may further comprise a gate insulating layer formed on the halide perovskite layer or the electrode layer, wherein a gate electrode may be formed on the gate insulating layer and configured to provide an input electrode (Vin).

According to an embodiment of the present application, the halide perovskite layer may be characterized by being configured in any one of a three-dimensional thin film structure, a two-dimensional thin film structure, and a mixed form thereof.

Hereinafter, a semiconductor device using a halide perovskite thin film and a manufacturing process thereof according to an embodiment of the present application will be described in more detail with reference to FIGS. 1 to 8.

Embodiment 1: Basic Complementary Semiconductor Device Structure

FIG. 1(a) is a schematic diagram viewed from the top of a halide perovskite-based complementary semiconductor device 100 including two-dimensional materials according to an embodiment of the present invention. FIG. 1(b) is a cross-sectional schematic diagram viewed from the side of a halide perovskite-based complementary semiconductor device 100 including two-dimensional materials according to an embodiment of the present invention. Specifically, FIG. 1(b) is a schematic diagram showing a cross-section of the semiconductor device 100 of FIG. 1(a) cut along the A-A' line. FIG. 2 is a schematic diagram viewed from the top with an enlarged view of the two-dimensional materials presented in FIGS. 1(a) and 1(b).

Referring to FIGS. 1(a) and 1(b), a halide perovskite-based complementary semiconductor device 100 according to a first embodiment of the present invention is shown. The semiconductor device 100 may include a substrate 120, a gate insulating layer 130, a two-dimensional material layer 140, a halide perovskite layer 150, and an electrode layer 160.

The substrate 120 is a structure that serves as the foundation of the semiconductor device 100, and may be composed of various materials such as a silicon substrate, a glass substrate, or a flexible substrate. For example, the substrate 120 may be a silicon substrate in the form of a silicon wafer.

The gate insulating layer 130 is formed on the substrate 120 and may be composed of an oxide insulator or the like. Specifically, the gate insulating layer 130 may be formed on an upper surface side of the substrate 120.

The two-dimensional material layer 140 may be formed on the gate insulating layer 130. Specifically, the two-dimensional material layer 140 may be formed on at least a portion of a surface of the gate insulating layer 130. Furthermore, the two-dimensional material layer 140 may be composed of a transition metal chalcogenide material (e.g., transition metal dichalcogenide (TMD) material). The two-dimensional material layer 140 may be composed of a transition metal chalcogenide material including any one of $WS_2$, $MoS_2$, $WSe_2$, or $MoSe_2$, and in this embodiment, $WS_2$ will be described as an example. However, this is merely for convenience of description and should not be interpreted as limiting.

As shown in FIG. 2, the two-dimensional material layer 140 may be formed to have at least one hexagonal structural pattern composed of regions with many W-vacancies 140-1 and regions with many S-vacancies 140-2 that are alternately arranged with respect to the center. Here, the regions with many W-vacancies 140-1 act as hole injection regions serving as a hole injection layer, and the regions with many S-vacancies 140-2 act as electron injection regions serving as an electron injection layer.

The halide perovskite layer 150 is formed on the two-dimensional material layer 140 and may be composed of a halide perovskite material selected from the group consisting of organic-inorganic hybrid halide perovskite materials, all-inorganic halide perovskite materials, Pb-free halide perovskite materials, mixed halide materials, two-dimensional halide perovskite materials, double perovskite materials, vacancy-ordered halide perovskite materials, and combinations thereof.

The organic-inorganic hybrid halide perovskite material may be $MAPbI_3$, $MAPbBr_3$, $MAPbCl_3$, $FAPbI_3$, $FAPbBr_3$, or $FAPbCl_3$.

The all-inorganic halide perovskite material may be $CsPbI_3$, $CsPbBr_3$, $CsPbCl_3$, $RbPbI_3$, $RbPbBr_3$, $RbPbCl_3$, or $CsPb(I_{1-x}Br_x)_3$.

The Pb-free halide perovskite material may be $MASnI_3$, $MASnBr_3$, $MASnCl_3$, $FASnI_3$, $FASnBr_3$, $FASnCl_3$, $CsSnI_3$, $CsSnBr_3$, $CsSnCl_3$, $MAGeI_3$, $FAGeI_3$, $CsGeI_3$, $Cs_2AgBiBr_6$, $Cs_2AgBiCl_6$, or $Cs_2AgSbBr_6$.

The mixed halide perovskite material may be $MAPb(I_{1-x}Br_x)_3$, $CsPb(Br_{1-x}Cl_x)_3$, or $FAPb(I_{1-x}Br_x)_3$.

The two-dimensional halide perovskite material may be $(PEA)_2PbI_4$ (Phenethylammonium Lead Iodide), $(FPEA)_2PbI_4$ (4-fluoro-phenethylammonium lead iodide), $(PEA)_2SnI_4$ (Phenethylammonium Tin Iodide), $(FPEA)_2SnI_4$ (4-fluoro-phenethylammonium Tin iodide), or $(BA)_2(MA)_{n-1}Pb_nI_{3n+1}$ (Butylammonium-based) having a $(R—NH_3)_2(A)_{n-1}(BX_3)_n$ structure.

The double perovskite material may be $Cs_2AgBiBr_6$ or $Cs_2InBiCl_6$.

The vacancy-ordered halide perovskite material may be $Cs_2SnI_6$ or $Cs_2TiI_6$.

Therefore, according to an embodiment of the present application, the halide perovskite layer may be characterized by being selected from the group consisting of $MAPbI_3$, $MAPbBr_3$, $MAPbCl_3$, $FAPbI_3$, $FAPbBr_3$, $FAPbCl_3$, $CsPbI_3$, $CsPbBr_3$, $CsPbCl_3$, $RbPbI_3$, $RbPbBr_3$, $RbPbCl_3$, $CsPb(I_{1-x}Br_x)_3$, $MASnI_3$, $MASnBr_3$, $MASnCl_3$, $FASnI_3$, $FASnBr_3$, $FASnCl_3$, $CsSnI_3$, $CsSnBr_3$, $CsSnCl_3$, $MAGeI_3$, $FAGeI_3$, $CsGeI_3$, $Cs_2AgBiBr_6$, $Cs_2AgBiCl_6$, $Cs_2AgSbBr_6$, $MAPb(I_{1-x}Br_x)_3$, $CsPb(Br_{1-x}Cl_x)_3$, $FAPb(I_{1-x}Br_x)_3$, $(PEA)_2PbI_4$ (Phenethylammonium Lead Iodide), $(FPEA)_2PbI_4$ (4-fluoro-phenethylammonium lead iodide), $(PEA)_2SnI_4$ (Phenethylammonium Tin Iodide), $(FPEA)_2SnI_4$ (4-fluoro-phenethylammonium Tin iodide), $(BA)_2(MA)_{n-1}Pb_nI_{n+1}$ (Butylammonium-based), $Cs_2AgBiBr_6$, $Cs_2InBiCl_6$, $Cs_2SnI_6$, $Cs_2TiI_6$, and combinations thereof.

However, this is merely an example, and any suitable material may be selected as the halide perovskite material of the halide perovskite layer.

The thickness of the halide perovskite layer 150 is preferably formed within a range of 1 nm to 100 nm. If thicker than 100 nm, the two-dimensional material in the lower layer is not visible after stacking, making electrode alignment difficult and increasing electrical resistance, resulting in deteriorated device performance. If thinner than 1 nm, it may not function as a channel, making operation of the complementary semiconductor device impossible.

The electrode layer 160 is formed on the halide perovskite layer 150 and may include a drain electrode 160-1, output electrodes 160-2, 160-3, and a source electrode 160-4. The drain electrode 160-1 is connected to a power supply voltage (VDD), the source electrode 160-4 is connected to a ground voltage (VSS), and each of the output electrodes 160-2, 160-3 is configured to provide an output voltage (Vout). In addition, a rear input electrode layer 110 may be formed on a rear surface side of the substrate 120 (i.e., the opposite side of the substrate 120 where the gate insulating layer 130 is formed), and the rear input electrode layer 110 may provide an input voltage (Vin).

The hole injection layer 140-1 corresponding to the region with many W-vacancies in the two-dimensional material layer 140 serves as a hole injection layer that takes electrons from the halide perovskite layer 150, enabling the corresponding region of the halide perovskite layer 150 to have p-type semiconductor characteristics. On the other hand, the electron injection layer 140-2 corresponding to the region with many S-vacancies serves to inject electrons into the halide perovskite layer 150, enabling the corresponding region of the halide perovskite layer 150 to have n-type semiconductor characteristics.

Specifically, the hole injection layer 140-1 forms a first contact potential at an interface with the halide perovskite layer 150, and the electron injection layer 140-2 forms a second contact potential at an interface with the halide perovskite layer 150. By the difference between the first contact potential and the second contact potential, a first region having p-type semiconductor characteristics and a second region having n-type semiconductor characteristics are locally formed in the halide perovskite layer 150, enabling operation of the complementary semiconductor device.

Hereinafter, a manufacturing method of the semiconductor device 100 according to Embodiment 1 of the present application will be described with reference to FIG. 3. In describing the manufacturing method of the semiconductor device 100, content that overlaps with the content described in relation to FIGS. 1 and 2 may be omitted. However, this is merely for convenience of description and should not be interpreted as limiting.

Figure 3:
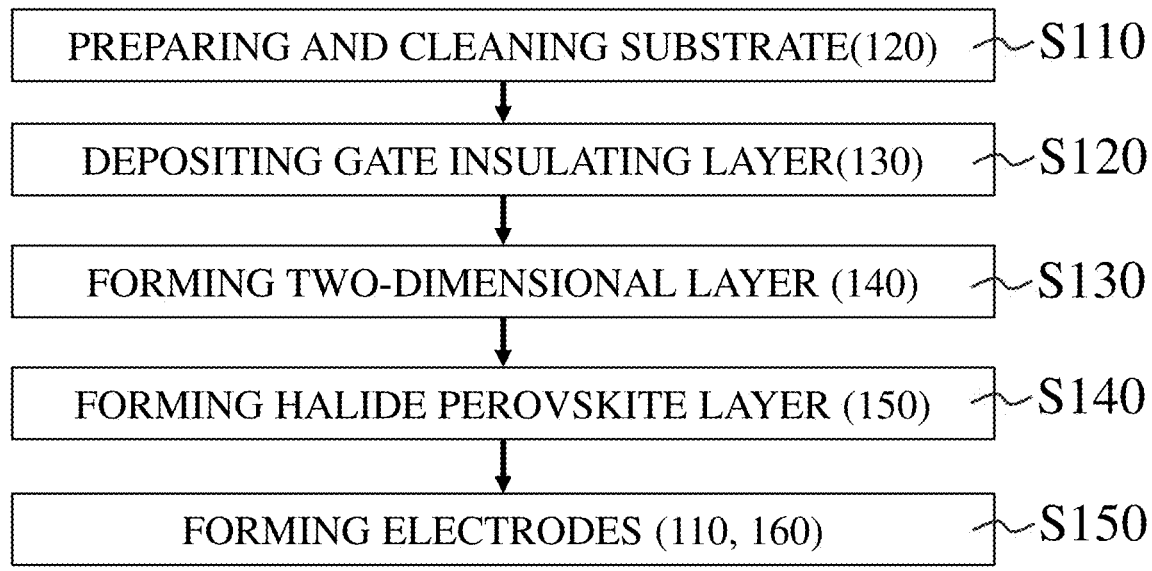
FIG. 3 shows the process sequence for fabricating the semiconductor device presented in FIG. 1.

FIG. 3 shows the process sequence for fabricating the semiconductor device 100 presented in FIGS. 1(a) and 1(b).

A manufacturing method of the semiconductor device 100 according to an embodiment of the present application may include preparing and cleaning the substrate 120 (S110), depositing the gate insulating layer 130 (S120), forming the two-dimensional material layer 140 (S130), forming the halide perovskite layer 150 (S140), and forming the electrodes 110, 160 (S150).

In step S110, a substrate 120, which is a structure serving as the foundation of the semiconductor device 100, may be provided and cleaned. The substrate 120 may be composed of various materials such as a silicon substrate (e.g., silicon wafer), a glass substrate, or a flexible substrate.

In step S120, the gate insulating layer 130 may be deposited on the substrate 120 prepared in step S110.

In step S130, the two-dimensional material layer 140 may be formed on the gate insulating layer 130 deposited in step S120. Here, the two-dimensional material layer 140, as described above, may be composed of a material including any one of $WS_2$, $MoS_2$, $WSe_2$, or $MoSe_2$, and may be formed to have at least one hexagonal structural pattern composed of regions with many W-vacancies 140-1 and regions with many S-vacancies 140-2 that are alternately arranged with respect to the center. Here, the regions with many W-vacancies 140-1 act as a hole injection layer, and the regions with many S-vacancies 140-2 act as an electron injection layer.

In step S140, the halide perovskite layer 150 may be formed on the two-dimensional material layer 140 formed in step S130. The halide perovskite layer 150 may be configured in any one of a three-dimensional thin film structure, a two-dimensional thin film structure, and a mixed form thereof. The three-dimensional (3D) thin film structure may be in the form of an $ABX_3$ structure (A: organic or inorganic cation, B: metal cation, X: halogen anion), and examples of halide perovskite-based materials having a three-dimensional thin film structure may include $MAPbI_3$, $FAPbI_3$, $CsPbI_3$, $RbPbI_3$, $MASnI_3$, $FASnI_3$, $CsSnI_3$, $MAPbBr_3$, FAPbBr$_3$, CsPbBr$_3$, RbPbBr$_3$, MASnBr$_3$, FASnBr$_3$, CsSnBr$_3$, and the like. The three-dimensional thin film structure has excellent charge mobility and has the advantage that electrons and holes can easily move in all directions. The two-dimensional (2D) thin film structure may be in the form of a layered structure of (R—NH$_3$)$_2$BX$_4$ or A$_2$BX$_4$ type, and examples of halide perovskite-based materials having a two-dimensional thin film structure may include PEASnI$_3$, PEAPbI$_3$, PEASnBr$_3$, PEAPbBr$_3$, and the like. The two-dimensional thin film structure has higher stability compared to the three-dimensional structure and has adjustable band gap due to quantum confinement effects, and has characteristics of smooth charge transport in the plane direction but limited charge transport in the vertical direction.

In step S150, an electrode layer 160 including a drain electrode 160-1, output electrodes 160-2, 160-3, and a source electrode 160-4 may be formed on at least a portion of the halide perovskite layer 150 formed in step S140. Furthermore, in step S150, a rear input electrode layer 110 may be formed on a rear surface side of the substrate 120.

Embodiment 2: Complementary Semiconductor Device with Added Passivation Layer 170

Figure 2:
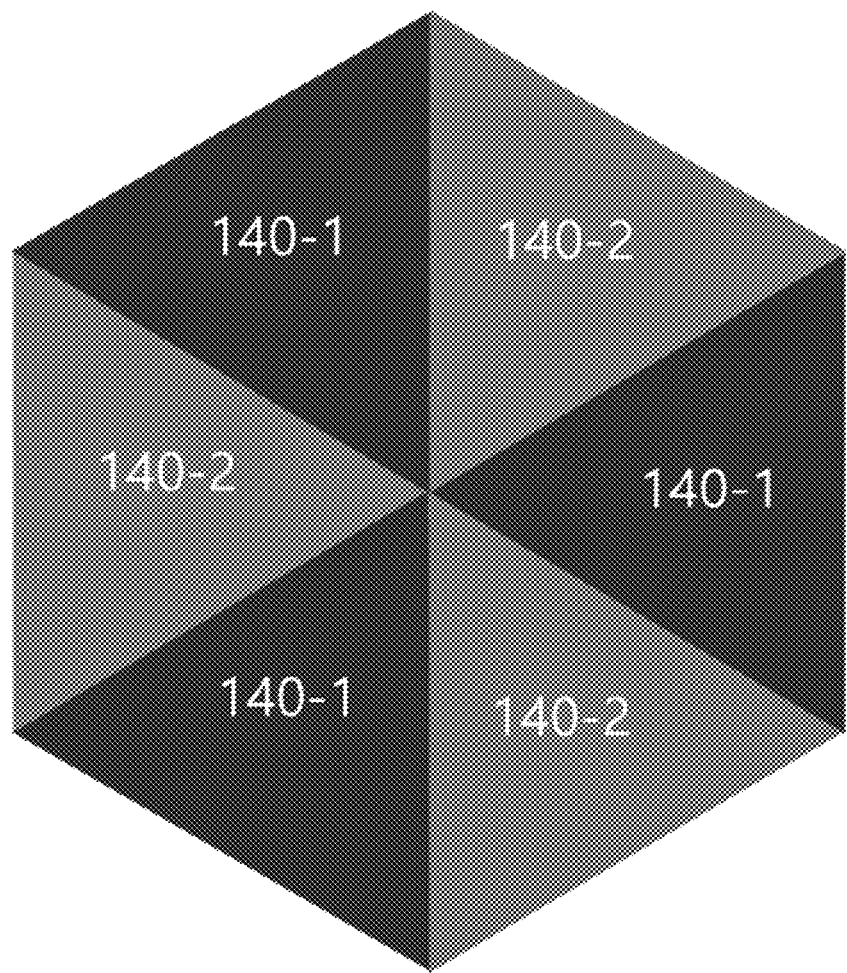
FIG. 2 is a schematic diagram viewed from the top with an enlarged view of the two-dimensional materials presented in FIG. 1.

FIGS. 4(a) and 4(b) are schematic diagrams of a device for an embodiment in which a passivation layer 170 is added to improve stability in the device presented in FIG. 1. Specifically, FIG. 4(b) is a schematic diagram showing a cross-section of the semiconductor device 100 of FIG. 4(a) cut along the A-A' line.

Referring to FIGS. 4(a) and 4(b), a halide perovskite-based complementary semiconductor device 100 according to a second embodiment of the present invention is shown. The second embodiment is a form in which a passivation layer 170 is added to the structure of the first embodiment.

The passivation layer 170 may be formed on at least a portion of the halide perovskite layer 150 and the electrode layer 160. The passivation layer 170 may serve to protect the semiconductor device from external environment to improve stability. In particular, since halide perovskite materials have characteristics vulnerable to moisture, long-term stability can be secured by protecting the device from moisture through the passivation layer 170.

Hereinafter, a manufacturing method of the semiconductor device 100 according to Embodiment 2 of the present application will be described with reference to FIG. 5. In describing the manufacturing method of the semiconductor device 100, content that overlaps with the content described in relation to FIGS. 1 to 4 may be omitted. However, this is merely for convenience of description and should not be interpreted as limiting.

Figure 4:
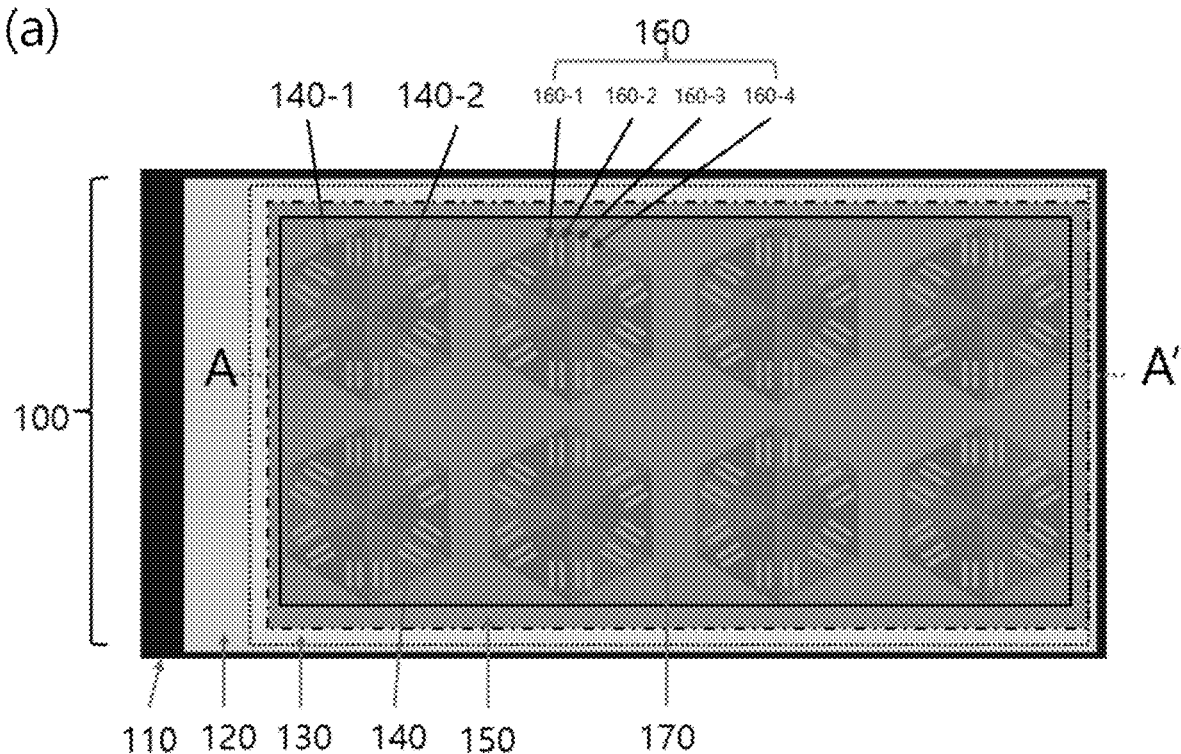
FIG. 4 shows schematic diagrams of a device for an embodiment in which a passivation layer is added to improve stability in the device presented in FIG. 1.
Figure 4:
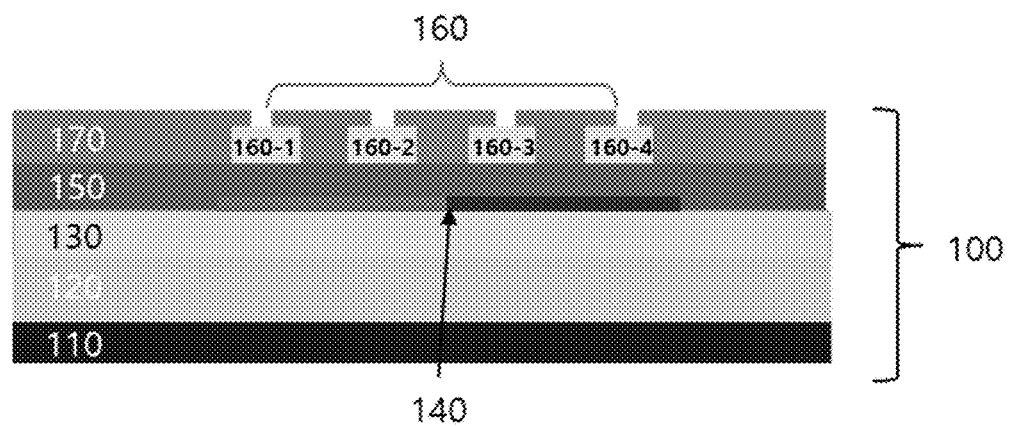
Figure 5:
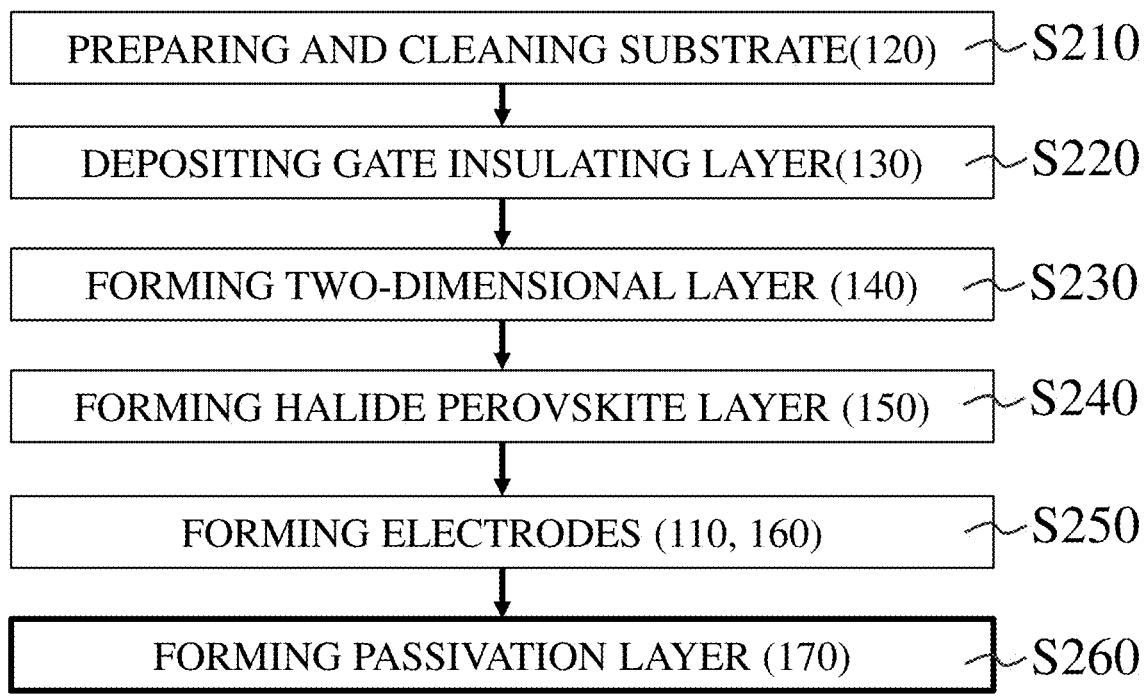
FIG. 5 shows the process sequence for the embodiment of FIG. 4.
Figure 6:
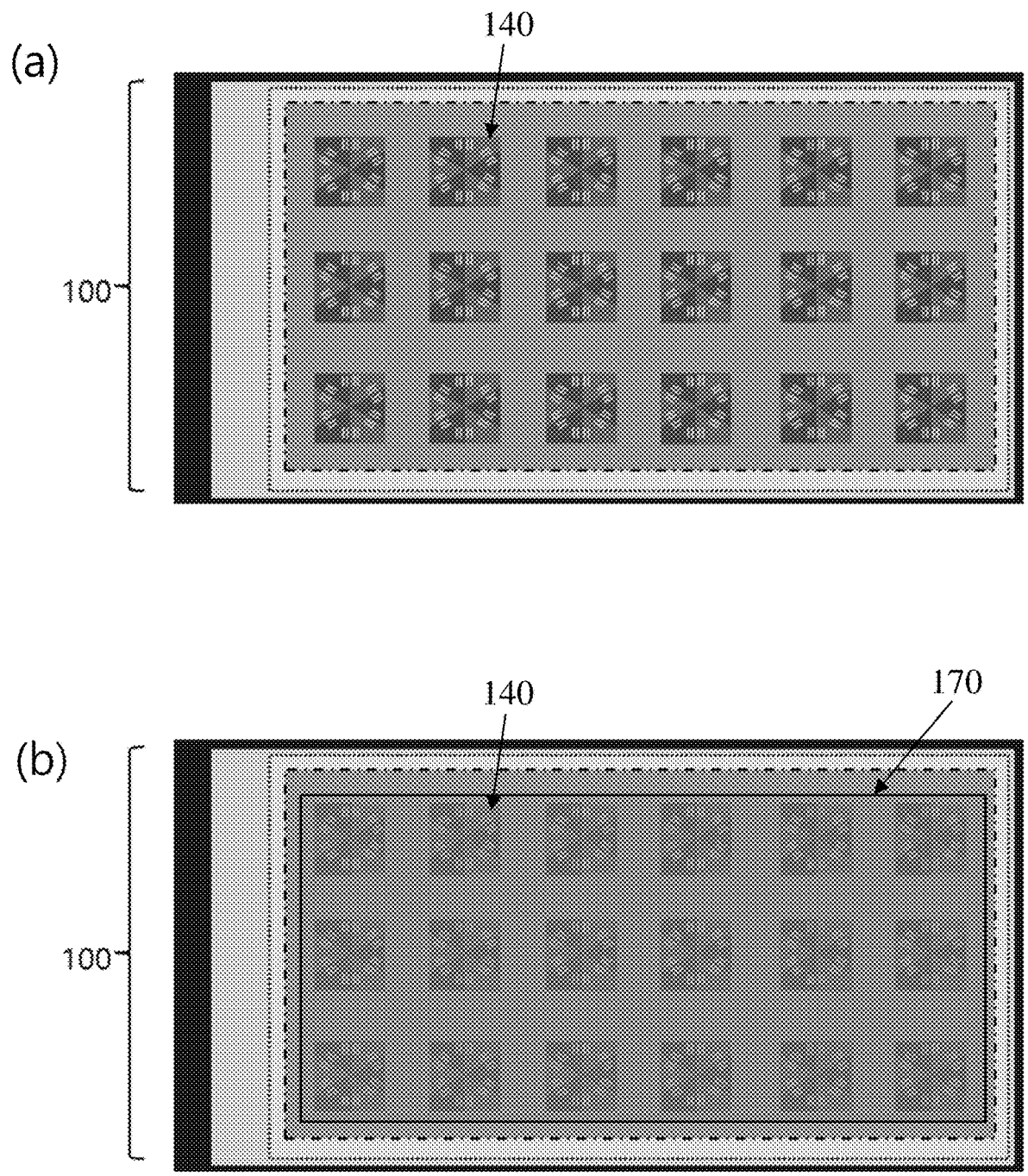
FIG. 6 shows schematic diagrams of a device manufactured with additional processes for improving integration density in another embodiment.

FIG. 5 shows the process sequence for the embodiment of FIG. 4.

A manufacturing method of the semiconductor device 100 according to an embodiment of the present application may include preparing and cleaning the substrate 120 (S210), depositing the gate insulating layer 130 (S220), forming the two-dimensional material layer 140 (S230), forming the halide perovskite layer 150 (S240), forming the electrodes 110, 160 (S250), and forming the passivation layer 170 (S260). Meanwhile, since steps S110, S120, S130, S140, and S150 described in Embodiment 1 can be applied substantially identically to steps S210, S220, S230, S240, and S250 regarding Embodiment 2 to be described later, description thereof will be omitted and the description will focus on step S260.

In step S260, a passivation layer 170 may be formed on at least a portion of the halide perovskite layer 150 formed in step S240 and the electrode layer 160 formed in step S250. As described above, the passivation layer 170 may serve to protect the semiconductor device from external environment to improve stability.

Embodiment 3: Quadrilateral Pattern Structure for Improving Device Integration Density FIGS. 6(a) and 6(b) are schematic diagrams of a device manufactured with additional processes for improving device integration density in another embodiment.

Referring to FIGS. 6(a) and 6(b), a halide perovskite-based complementary semiconductor device 100 according to a third embodiment of the present invention is shown. In the third embodiment, a structure is presented in which a two-dimensional material with a hexagonal structural pattern is patterned into a quadrilateral structural pattern through mechanical scribing or laser scribing to improve device integration density. The quadrilateral structural pattern has advantages of increasing space utilization in integrated circuit design and improving compatibility with existing semiconductor process technologies.

Hereinafter, a manufacturing method of the semiconductor device 100 according to Embodiment 3 of the present application will be described with reference to FIG. 7. In describing the manufacturing method of the semiconductor device 100, content that overlaps with the content described in relation to FIGS. 1 to 6 may be omitted. However, this is merely for convenience of description and should not be interpreted as limiting.

Figure 7:
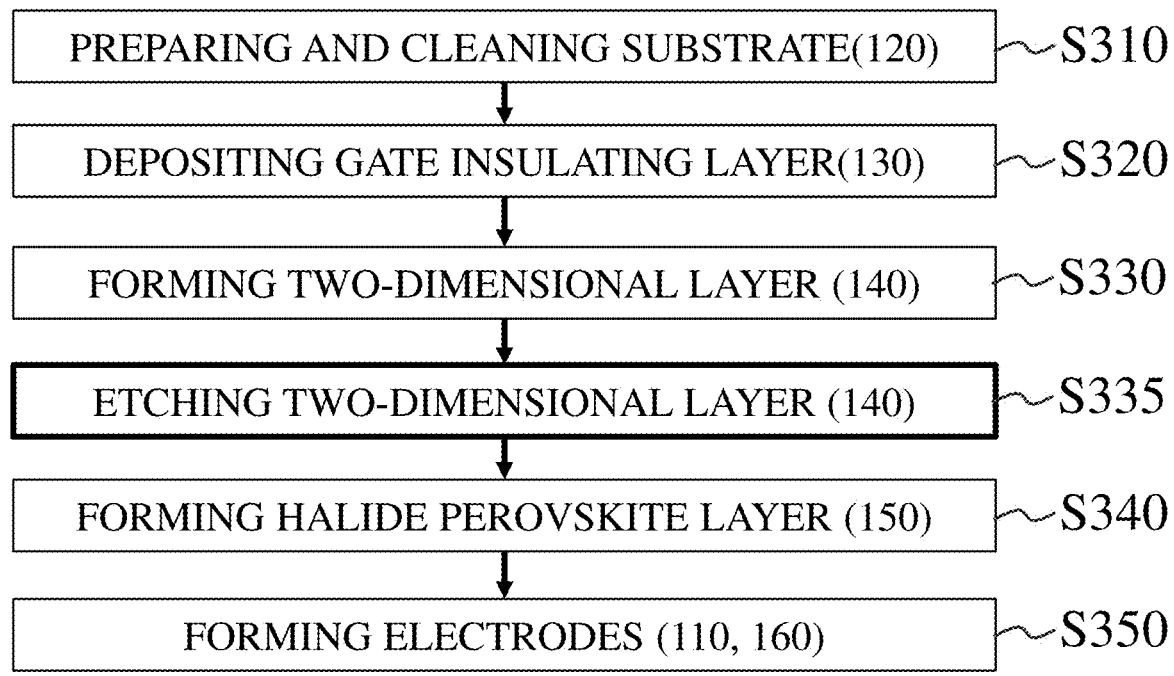
FIG. 7 shows the process sequence for the embodiment of FIG. 6.

FIG. 7 shows the manufacturing process sequence for a device with a quadrilateral pattern structure, and may further include a process of etching at least one two-dimensional material (e.g., TMD) included in the two-dimensional material layer 140 into a quadrilateral shape after forming the two-dimensional material layer 140.

Specifically, a manufacturing method of the semiconductor device 100 according to an embodiment of the present application may include preparing and cleaning the substrate 120 (S310), depositing the gate insulating layer 130 (S320), forming the two-dimensional material layer 140 (S330), etching the two-dimensional material layer 140 (S335), forming the halide perovskite layer 150 (S340), and forming the electrodes 110, 160 (S350). Meanwhile, since steps S110, S120, S130, S140, and S150 described in Embodiment 1 can be applied substantially identically to steps S310, S320, S330, S340, and S350 regarding Embodiment 3 to be described later, description thereof will be omitted and the description will focus on step S335.

In step S335, at least one two-dimensional material included in the two-dimensional material layer 140 formed in step S330 may be etched by mechanical scribing or laser scribing. Specifically, the at least one two-dimensional material included in the two-dimensional material layer 140 formed in step S330 may be formed to have a structural pattern other than quadrilateral (e.g., hexagonal structural pattern (see FIG. 2)). Specifically, the two-dimensional material may be formed on the substrate through a direct growth method (e.g., chemical vapor deposition (CVD)) or a dry transfer method in which the two-dimensional material is attached to the substrate. At this time, in step S335 of the manufacturing method of the semiconductor device according to an embodiment of the present application, a process of etching the two-dimensional material having a hexagonal structural pattern to have a quadrilateral structural pattern (e.g., square structural pattern) through mechanical scribing or laser scribing may be performed. As described above, the quadrilateral structural pattern can provide advantages of increasing space utilization in integrated circuit design and improving compatibility with existing semiconductor process technologies.

Meanwhile, although not shown in FIG. 7, the manufacturing method of the semiconductor device 100 according to Embodiment 3 of the present application may further include a step of forming a passivation layer 170 (S360), which is substantially identical to step S260 described in FIG. 5, after the step of forming the electrodes 160, 110 (S350). Since the descriptions of the passivation layer 170 and step S260 described above can be applied mutatis mutandis to this, they will be omitted for convenience of description.

Embodiment 4: Complementary Semiconductor Device with Top Gate Structure

Figure 8:
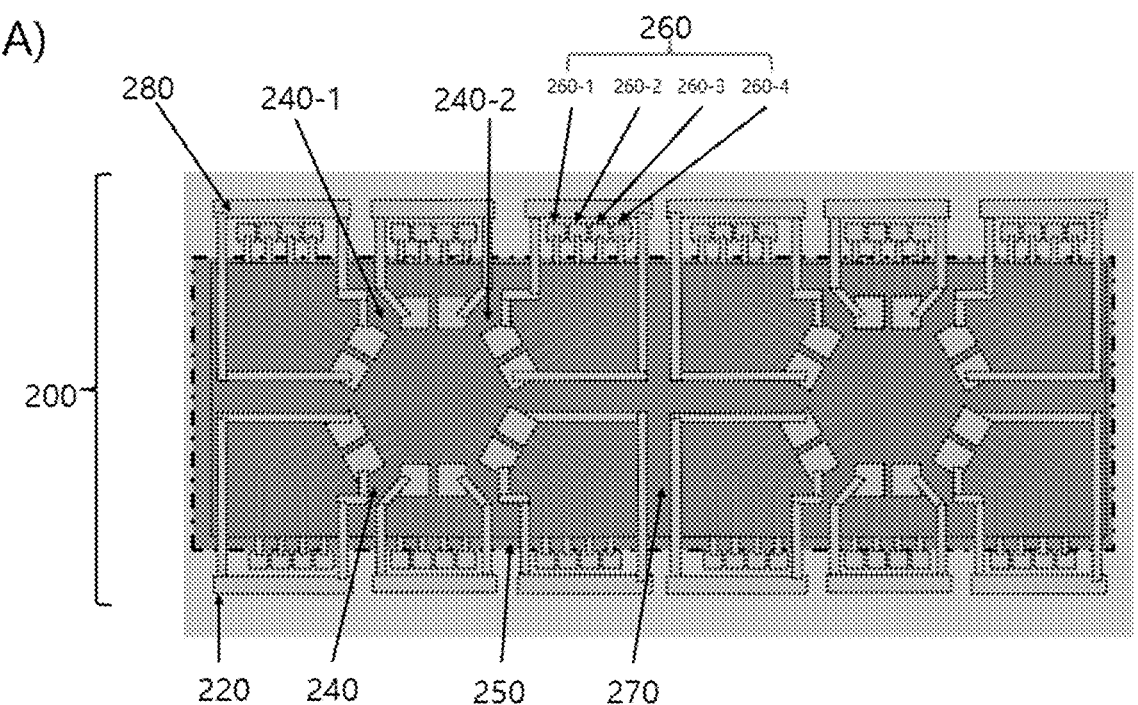
FIG. 8 shows device schematic diagrams for fabricating a top gate complementary semiconductor device in another embodiment, showing top and cross-sectional views.
Figure 8:
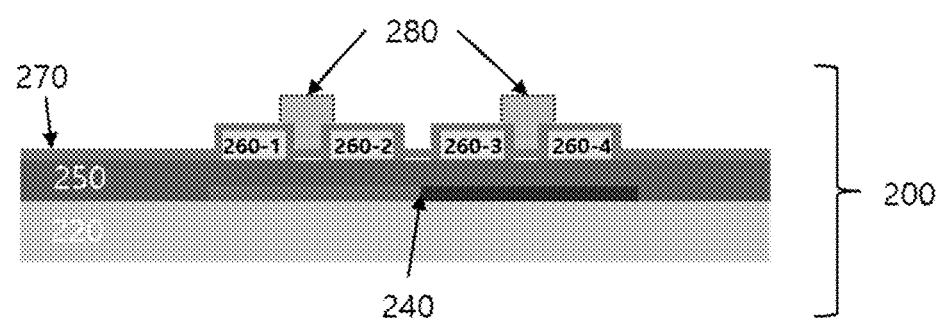

Hereinafter, the semiconductor device 200 according to Embodiment 4 of the present application will be described in more detail with reference to FIG. 8. Meanwhile, since the two-dimensional material layer 140, halide perovskite layer 150, and electrode layer 160 described in Embodiments 1 to 3 can be applied substantially identically to the two-dimensional material layer 240, halide perovskite layer 250, and electrode layer 260 regarding Embodiment 4 to be described later, description thereof will be omitted, and the description will focus on the substrate 220, gate insulating layer 270, and gate electrode 280 that are changed compared to Embodiments 1 to 3.

FIGS. 8(a) and 8(b) are device schematic diagrams for fabricating a top gate complementary semiconductor device in another embodiment, showing top and cross-sectional views.

Referring to FIGS. 8(a) and 8(b), a halide perovskite-based top gate complementary semiconductor device 200 according to a fourth embodiment of the present invention is shown. The semiconductor device 200 according to the fourth embodiment uses a glass substrate or flexible substrate 220 instead of the substrate 120 in the form of a silicon wafer, and has a structure in which the gate electrode 280 is disposed on top of the semiconductor device 200.

In the top gate structure, the two-dimensional material layer 240, halide perovskite layer 250, and electrode layer 260 are sequentially formed on the substrate 220, and a gate insulating layer 270 may be formed on at least a portion of the halide perovskite layer 250 and/or the electrode layer 260. Furthermore, a gate electrode 280 may be formed on the gate insulating layer 270, and the gate electrode 280 may be configured to provide an input electrode (Vin). The semiconductor device 200 according to this embodiment can be applied to various substrates since it does not require the use of a substrate in the form of a silicon wafer, and may be particularly suitable for implementing flexible electronic devices.

The two-dimensional material layer 240, like Embodiment 1, is composed of regions with many W-vacancies 240-1 (i.e., hole injection layer) and regions with many S-vacancies 240-2 (i.e., electron injection layer), and can form regions having p-type and n-type characteristics, respectively, by injecting holes and electrons into the halide perovskite layer 250, respectively. In addition, the electrode layer 260 includes a drain electrode 260-1, output electrodes 260-2, 260-3, and a source electrode 260-4, and the gate electrode 280 may provide an input voltage (Vin).

The present invention described above can implement a single material-based complementary semiconductor device by locally controlling the semiconductor characteristics of the halide perovskite layer using intrinsic vacancy characteristics of two-dimensional materials. This can provide excellent advantages in terms of process simplification, performance uniformity, and device stability compared to conventional methods of combining different materials.

The two-dimensional material layer that plays a key role in the present invention, particularly the W-vacancy and S-vacancy characteristics of $WS_2$, can be naturally formed during the CVD (Chemical Vapor Deposition) growth process, and the charge distribution of the halide perovskite layer can be effectively controlled by precisely controlling these vacancy structures. The W-vacancy region of the two-dimensional material layer causes a p-type doping effect by attracting electrons from the halide perovskite layer to increase hole concentration, and the S-vacancy region can cause an n-type doping effect by supplying electrons to the halide perovskite layer.

By utilizing this principle, the present invention can implement CMOS (Complementary Metal-Oxide-Semiconductor) circuits, which are the basic structure of complementary semiconductor devices, by locally forming p-type and n-type regions within the same halide perovskite layer. This can be effectively utilized particularly in implementing logic circuits such as inverters, NAND gates, and NOR gates.

Furthermore, the structure presented in the present invention can provide the possibility of being applied to various optoelectronic devices such as photodetectors, solar cells, and light-emitting diodes by combining with the excellent optoelectronic characteristics of halide perovskite materials. The absorption wavelength band can be controlled by adjusting the thickness and composition of the halide perovskite layer, and the charge transport characteristics can be optimized through the vacancy structure of the two-dimensional material layer.

The passivation layer, quadrilateral patterning structure, top gate structure, etc., presented in various embodiments of the present invention can be selectively applied according to actual application environments and purposes, thereby improving device stability, integration density, and applicability to various substrates.

In conclusion, the halide perovskite-based complementary semiconductor device according to the present invention can overcome the limitations of existing technologies and present new possibilities for the development of next-generation electronic devices and optoelectronic devices through an innovative approach utilizing vacancy characteristics of two-dimensional materials.

The features, structures, effects, etc. described in the above embodiments are included in at least one embodiment of the present invention and are not necessarily limited to only one embodiment. Furthermore, the features, structures, effects, etc. exemplified in each embodiment can be combined or modified for other embodiments by those having ordinary knowledge in the field to which the embodiments belong. Therefore, contents related to such combinations and modifications should be interpreted as being included in the scope of the present invention.

In addition, although the description has been made centering on the embodiments above, this is merely an example and does not limit the present invention, and those having ordinary knowledge in the field to which the present invention belongs will be able to recognize that various modifications and applications not exemplified above are possible within the scope that does not depart from the essential characteristics of the present embodiment. That is, each component specifically shown in the embodiments can be modified and implemented. And differences related to such modifications and applications should be interpreted as being included in the scope of the present invention as defined in the appended claims.

DESCRIPTION OF REFERENCE NUMERALS

100: Semiconductor device
120: Substrate
140: Two-dimensional material layer
150: Halide perovskite layer
160: Electrode layer

What is claimed is:

1. A semiconductor device comprising:
a substrate;
a two-dimensional material layer formed on an upper surface side of the substrate and including a hole injection layer and an electron injection layer;
a halide perovskite layer formed on the two-dimensional material layer;
an electrode layer formed on the halide perovskite layer and including a drain electrode, an output electrode, and a source electrode, wherein the drain electrode is connected to a power supply voltage (VDD), the source electrode is connected to a ground voltage (VSS), and the output electrode is configured to provide an output voltage (Vout); and
an input electrode configured to provide an input voltage (Vin),
wherein the hole injection layer of the two-dimensional material layer injects holes into the halide perovskite layer so that a first region of the halide perovskite layer has p-type semiconductor characteristics, and
wherein the electron injection layer of the two-dimensional material layer injects electrons into the halide perovskite layer so that a second region of the halide perovskite layer has n-type semiconductor characteristics.

2. The semiconductor device of claim 1, wherein:
the hole injection layer forms a first contact potential at an interface with the halide perovskite layer,
the electron injection layer forms a second contact potential at an interface with the halide perovskite layer, and
the first region having p-type semiconductor characteristics and the second region having n-type semiconductor characteristics are locally formed in the halide perovskite layer by a difference between the first contact potential and the second contact potential.

3. The semiconductor device of claim 1, wherein the two-dimensional material layer comprises a transition metal chalcogenide material including any one of $WS_2$, $MoS_2$, $WSe_2$, and $MoSe_2$.

4. The semiconductor device of claim 1, wherein:
the two-dimensional material layer includes $WS_2$,
the hole injection layer comprises W-vacancy $WS_2$, and
the electron injection layer comprises S-vacancy $WS_2$.

5. The semiconductor device of claim 1, wherein the halide perovskite layer is selected from the group consisting of $MAPbI_3$, $MAPbBr_3$, $MAPbCl_3$, $FAPbI_3$, $FAPbBr_3$, $FAPbCl_3$, $CsPbI_3$, $CsPbBr_3$, $CsPbCl_3$, $RbPbI_3$, $RbPbBr_3$, $RbPbCl_3$, $CsPb(I_{1-x}Br_x)_3$, $MASnI_3$, $MASnBr_3$, $MASnCl_3$, $FASnI_3$, $FASnBr_3$, $FASnCl_3$, $CsSnI_3$, $CsSnBr_3$, $CsSnCl_3$, $MAGeI_3$, $FAGeI_3$, $CsGeI_3$, $Cs_2AgBiBr_6$, $Cs_2AgBiCl_6$, $Cs_2AgSbBr_6$, $MAPb(I_{1-x}Br_x)_3$, $CsPb(Br_{1-x}Cl_x)_3$, $FAPb(I_{1-x}Br_x)_3$, $(PEA)_2PbI_4$ (Phenethylammonium Lead Iodide), $(FPEA)_2PbI_4$ (4-fluoro-phenethylammonium lead iodide), $(PEA)_2SnI_4$ (Phenethylammonium Tin Iodide), $(FPEA)_2SnI_4$ (4-fluoro-phenethylammonium Tin iodide), $(BA)_2(MA)_{n-1}Pb_nI_{3n+1}$ (Butylammonium-based), $Cs_2AgBiBr_6$, $Cs_2InBiCl_6$, $Cs_2SnI_6$, $Cs_2TiI_6$, and combinations thereof.

6. The semiconductor device of claim 1, further comprising:
a rear input electrode layer formed on a rear surface side of the substrate,
wherein the rear input electrode layer includes the input electrode and is configured to provide the input voltage (Vin).

7. The semiconductor device of claim 1, further comprising:
a passivation layer formed on at least a portion of the halide perovskite layer and the electrode layer,
wherein the passivation layer protects devices included in the semiconductor device from external environment to improve stability.

8. The semiconductor device of claim 1, further comprising:
a gate insulating layer formed between the substrate and the two-dimensional material layer,
wherein the two-dimensional material layer is formed on at least a portion of a surface of the gate insulating layer.

9. The semiconductor device of claim 1, wherein the two-dimensional material layer is formed to have a pattern with a quadrilateral structure patterned by etching a material having a hexagonal structural pattern through mechanical scribing or laser scribing.

10. The semiconductor device of claim 1, wherein:
the substrate is formed of glass or a flexible substrate,
further comprising a gate insulating layer formed on the halide perovskite layer or the electrode layer,
wherein a gate electrode as the input electrode is formed on the gate insulating layer and configured to provide the input voltage (Vin).

11. The semiconductor device of claim 1, wherein the halide perovskite layer is configured in any one of a three-dimensional thin film structure, a two-dimensional thin film structure, and a mixed form thereof.

12. The semiconductor device of claim 1, wherein the two-dimensional material layer is formed to have at least one two-dimensional material having at least one hexagonal structural pattern.

13. The semiconductor device of claim 12, wherein the hexagonal structural pattern is configured by being divided into hole injection regions corresponding to the hole injection layer and electron injection regions corresponding to the electron injection layer, which are alternately arranged with respect to the center.

* * * * *